United States Patent
Hafez et al.

(10) Patent No.: US 12,389,626 B2
(45) Date of Patent: Aug. 12, 2025

(54) HIGH-VOLTAGE TRANSISTOR WITH SELF-ALIGNED ISOLATION

(71) Applicant: Intel Corporation, Santa Clara, CA (US)

(72) Inventors: Walid M. Hafez, Portland, OR (US); Chia-Hong Jan, Portland, OR (US)

(73) Assignee: Intel Corproation, Santa Clara, CA (US)

( * ) Notice: Subject to any disclaimer, the term of this patent is extended or adjusted under 35 U.S.C. 154(b) by 835 days.

(21) Appl. No.: 16/889,610

(22) Filed: Jun. 1, 2020

(65) Prior Publication Data

US 2020/0295190 A1 Sep. 17, 2020

Related U.S. Application Data (63) Continuation of application No. 15/754,151, filed as application No. PCT/US2015/052204 on Sep. 25, 2015, now Pat. No. 10,707,346.

(51) Int. Cl.
*H10D 30/60* (2025.01)
*H10D 62/10* (2025.01)
(Continued)

(52) U.S. Cl.
CPC ......... *H10D 30/603* (2025.01); *H10D 62/116* (2025.01); *H10D 62/156* (2025.01); *H10D 64/017* (2025.01); *H10D 30/62* (2025.01)

(58) Field of Classification Search
CPC .. H10D 30/603; H10D 62/116; H10D 62/156; H10D 64/017; H01L 29/7835;
(Continued)

(56) References Cited

U.S. PATENT DOCUMENTS 6,252,284 B1 * 6/2001 Muller .............. H01L 29/78654
257/E29.283
8,609,510 B1 12/2013 Banna et al.
(Continued)

FOREIGN PATENT DOCUMENTS

WO WO 2017/052585 3/2017

OTHER PUBLICATIONS

Search Report from European Patent Application No. 19161058.3, mailed Jun. 28, 2019, 8 pgs.
(Continued)

*Primary Examiner* — Nathan W Ha
(74) *Attorney, Agent, or Firm* — Schwabe, Williamson & Wyatt P.C.

(57) ABSTRACT

A high-voltage transistor structure is provided that includes a self-aligned isolation feature between the gate and drain. Normally, the isolation feature is not self-aligned. The self-aligned isolation process can be integrated into standard CMOS process technology. In one example embodiment, the drain of the transistor structure is positioned one pitch away from the active gate, with an intervening dummy gate structure formed between the drain and active gate structure. The dummy gate structure is sacrificial in nature and can be utilized to create a self-aligned isolation recess, wherein the gate spacer effectively provides a template for etching the isolation recess. This self-aligned isolation forming process eliminates a number of the variation and dimensional constraints attendant non-aligned isolation forming techniques, which in turn allows for smaller footprint and tighter alignment so as to reduce device variation. The structure and forming techniques are compatible with both planar and non-planar transistor architectures.

20 Claims, 6 Drawing Sheets

(51) Int. Cl.
  *H10D 62/13* (2025.01)
  *H10D 64/01* (2025.01)
  *H10D 30/62* (2025.01)

(58) Field of Classification Search
  CPC ........... H01L 29/66545; H01L 29/0873; H01L 29/0653; H01L 29/785
  USPC ........................................................ 257/327
  See application file for complete search history.

(56) References Cited

U.S. PATENT DOCUMENTS

| | | | |
|---|---|---|---|
| 8,946,851 B1 | 2/2015 | McGregor et al. | |
| 9,082,852 B1 | 7/2015 | Liu et al. | |
| 2004/0222477 A1* | 11/2004 | Aller | H01L 27/1203 257/412 |
| 2007/0018273 A1 | 1/2007 | Miller | |
| 2007/0284659 A1 | 12/2007 | Abadeer et al. | |
| 2008/0079094 A1* | 4/2008 | Jin | H01L 29/66628 257/401 |
| 2009/0140372 A1 | 6/2009 | Hodel et al. | |
| 2011/0241073 A1 | 10/2011 | Cohen | |
| 2012/0193709 A1 | 8/2012 | Sukegawa et al. | |
| 2014/0191317 A1 | 7/2014 | Qian | |
| 2014/0264584 A1 | 9/2014 | Zhang et al. | |
| 2014/0291766 A1* | 10/2014 | Hafez | H01L 21/823431 438/296 |
| 2014/0353763 A1 | 12/2014 | Chung et al. | |
| 2018/0248039 A1* | 8/2018 | Hafez | H01L 29/7835 |

OTHER PUBLICATIONS

International Search Report and Written Opinion received for PCT Application No. PCT/US2015/052204. Mail Date: May 31, 2016, 10 pages.
International Preliminary Report on Patentability received for PCT Application No. PCT/US2015/052204. Mail Date: Apr. 5, 2018, 7 pages.
Office Action from Taiwan Patent Application No. 105126925, mailed Nov. 12, 2019, 7 pgs.
Notice of Allowance from Taiwan Patent Application No. 105126925, mailed Oct. 27, 2020, 3 pgs.
Office Action from European Patent Application No. 19161058.3, mailed Mar. 11, 2021, 6 pgs.
Office Action from Taiwan Patent Application No. 105126925, mailed May 18, 2020, 10 pgs.

* cited by examiner

Fig. 4 ary metal oxide semiconductor (CMOS) process technology. In one example embodiment, the drain of the transistor structure is positioned one pitch away from the active gate, with an intervening dummy gate structure formed between the drain and active gate structure. In other embodiments the drain of the transistor structure is positioned multiple pitches away from the active gate, with the intervening dummy gate structure formed therebetween. The dummy gate structure is sacrificial in nature and can be utilized to create a self-aligned isolation recess, wherein the gate spacer effectively provides a template for etching the isolation recess. This self-aligned forming process eliminates a number of the variation and dimensional constraints attendant non-aligned isolation forming techniques, which in turn allows for smaller footprint and tighter alignment so as to reduce device variation. The structure and forming techniques are compatible with both planar and non-planar transistor architectures.

General Overview

HIGH-VOLTAGE TRANSISTOR WITH SELF-ALIGNED ISOLATION

CROSS-REFERENCE TO RELATED APPLICATION

This patent application is a continuation of U.S. patent application Ser. No. 15/754,151 filed Feb. 21, 2018, which is a U.S. National Phase Application under 35 U.S.C. § 371 of International Application No. PCT/US2015/052204, filed Sep. 25, 2015, entitled "HIGH-VOLTAGE TRANSISTOR WITH SELF-ALIGNED ISOLATION," which designates the United States of America, the entire disclosure of which are hereby incorporated by reference in their entirety and for all purposes.

BACKGROUND

High-voltage transistors are a foundational element of numerous applications. For instance, such transistors are frequently used in constructing circuitry such as input/output (IO) circuitry, electrostatic discharge protection circuitry, clamps, and other off-chip interfaces of system-on-chip (SoC) configurations. An example high-voltage transistor device is the vertical drain metal oxide semiconductor (VDMOS) transistor. In a VDMOS transistor, the drain is separated from the gate through the use of shallow-trench isolation. As high-voltage is applied to the drain, the voltage is reduced before reaching the intrinsic gate, enabling higher voltage operation. There are a number of non-trivial challenges with this integration scheme.

BRIEF DESCRIPTION OF THE DRAWINGS

FIGS. 3f-g' collectively illustrate a method for forming a high-voltage transistor device, in accordance with another embodiment of the present disclosure.

As will be appreciated, the figures are not necessarily drawn to scale or intended to limit the disclosure to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

A high-voltage transistor structure is provided that includes a self-aligned isolation feature between the gate and drain. Normally, the isolation feature is not self-aligned. The self-aligned isolation process can be integrated into standard complementary metal oxide semiconductor (CMOS) process technology. In one example embodiment, the drain of the transistor structure is positioned one pitch away from the active gate, with an intervening dummy gate structure formed between the drain and active gate structure. In other embodiments the drain of the transistor structure is positioned multiple pitches away from the active gate, with the intervening dummy gate structure formed therebetween. The dummy gate structure is sacrificial in nature and can be utilized to create a self-aligned isolation recess, wherein the gate spacer effectively provides a template for etching the isolation recess. This self-aligned forming process eliminates a number of the variation and dimensional constraints attendant non-aligned isolation forming techniques, which in turn allows for smaller footprint and tighter alignment so as to reduce device variation. The structure and forming techniques are compatible with both planar and non-planar transistor architectures.

General Overview

As transistor technologies continue to scale and operate at lower core voltages, it is increasingly difficult to monolithically integrate high-voltage devices alongside standard (low-voltage) logic devices. For instance, core logic transistor dimensions reduce at a typical rate of 0.7× per node, while analog interfaces including high-voltage transistors do not scale as aggressively. In short, a large disparity exists between standard logic transistors and high-voltage transistors which creates process complexity due to different critical dimensions and densities of the two transistor types. This complexity gives rise to a number of non-trivial challenges with high-voltage transistor integration schemes. For example, the formation of a typical vertical drain n-type metal oxide semiconductor (VDNMOS) transistor relies on multiple process features that are not conducive to aggressive dimensional scaling. A standard VDNMOS transistor forming method uses a shallow-trench isolation (STI) between the drain and the gate to reduce the field under the active gate/drain junction. This is achieved by first patterning the STI into the bare silicon substrate, and then using lithographic re-alignment of the n-type well (N-well) and gate to that STI. Due to process variances, these dimensions are forced to be large relative to certain minimum critical dimension of the technology, as will be appreciated in light of this disclosure and further discussed with reference to FIG. 1.

Figure 1:
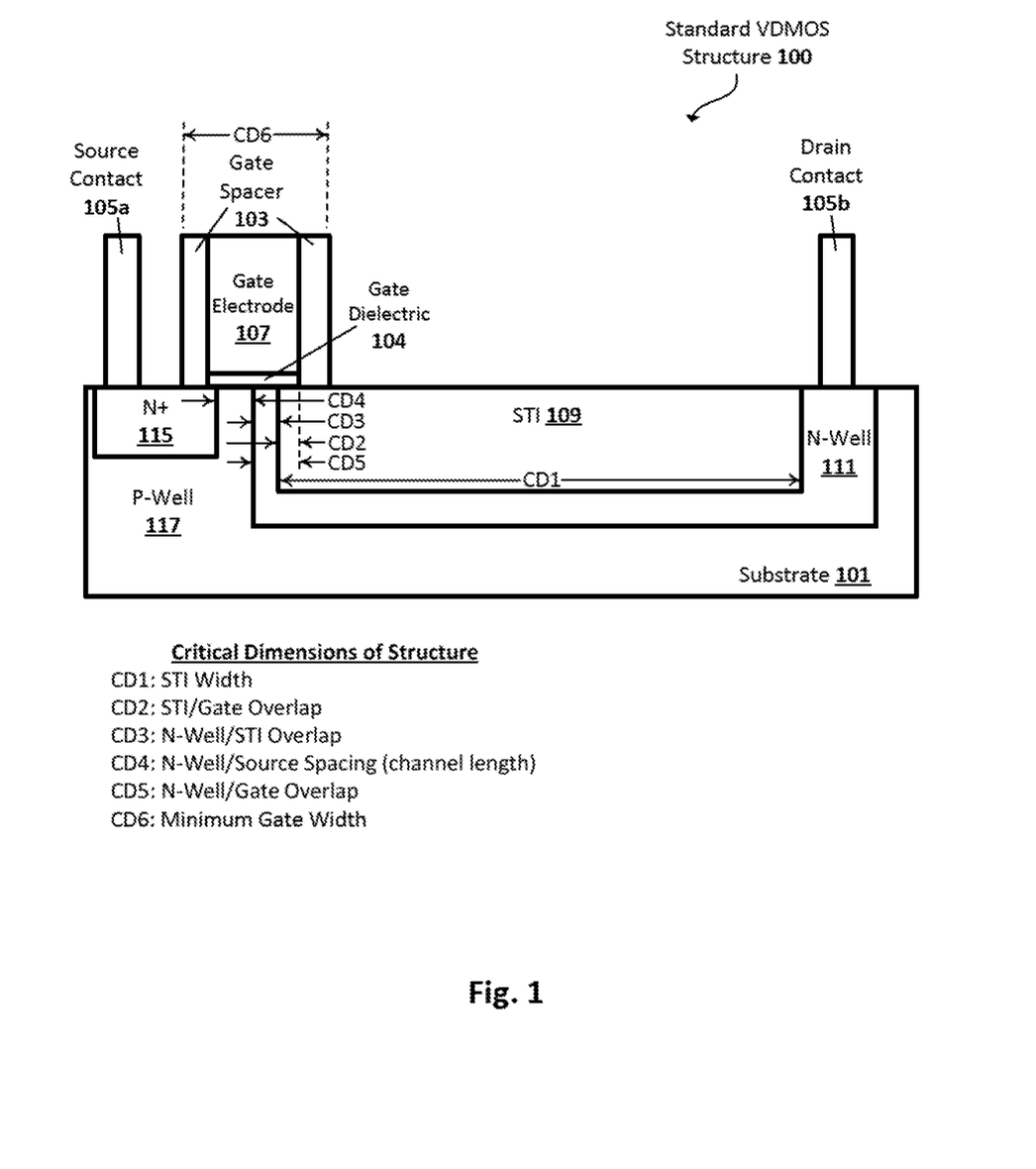
FIG. 1 illustrates a cross-sectional view of a standard high-voltage transistor device annotated with a number of critical dimensions, which may be helpful to understand various embodiments of the present disclosure.

FIG. 1 illustrates a cross-sectional view of a standard high-voltage VDNMOS transistor. However, the figure is further annotated with a number of critical dimensions, which may be helpful to understand various embodiments of the present disclosure. As can be seen, an N-well 111 is formed on a p-type substrate 101, and a P-well 117 is provided by virtue of the p-type substrate 101. A shallow trench isolation (STI) region 109 is formed within the N-Well 111 to provide isolation between the drain and gate regions. The N-well 111 may be formed in the substrate 101, for example, through ion implantation and/or diffusion of dopant(s) having the N-type conductivity, which is opposite that of the substrate 101 and P-well 117. The STI region 109 may be formed in the N-well 111, for example, through chemical etching and filling therein with an insulation material, such as oxide or nitride or other suitable insulation material. A gate structure is formed on an upper portion of the N-well 111 and the p-type substrate 101. The gate structure includes gate electrode 107, gate dielectric 104, and gate spacer 103. Diffusion region 115 is formed in the p-type substrate 101 near one edge of the gate electrode 107 to serve as the source region. A similar N+ diffusion region is provided within the N-well 111 for the drain and continues to the edge of the N-well 111 near the other edge of the gate electrode 107. Such diffusion regions may be, for example, heavily doped with N+ dopant(s) to improve contact resistance between the metal contact layer (105a and 105b) and the underlying semiconductor material of the diffusion (source/drain) regions. The diffusion doping scheme can vary, as will be appreciated. An insulation layer (not shown, such as silicon dioxide, silicon nitride, or other suitable insulator material) can then be grown or otherwise deposited over the entire surface of the substrate 101. The source and drain contacts 105a/105b can then be formed using a contact trench etch process to expose the underlying diffusion area followed by a deposition of contact metal.

In any case, and as previously explained, due to process variances, the various structure dimensions are forced to be large relative to certain minimum critical dimensions of the structure. Specifically, and as can be further scene with respect to FIG. 1, critical dimensions CD1 through CD5 must provide enough margin to encompass the process variation associated with each of the following: the width of the STI 109 (CD1); the alignment or overlap of the STI 109 with the gate (CD2); the alignment or overlap of the N-well 111 and the STI 109 (CD3); the alignment or overlap of the N-well 111 and the source diffusion 115 (CD4), which also corresponds to the channel length (the channel is between the N+ diffusion region 115 and the N-well 111); and the alignment or overlap of the N-well 111 and the gate 104/107 (CD5). Furthermore, due to the non-self-aligned nature of the standard formation process, the width of STI 109 (CD1) is restricted to typically 4-5× the minimum gate critical dimension (CD6) of the given technology node. As will be appreciated in light of this disclosure, this imposes limitations on the scalability of the transistor device.

Thus, and in accordance with an embodiment of the present disclosure, a high-voltage transistor structure is provided that includes a self-aligned isolation feature between the gate and drain, which can be integrated into, for example, standard CMOS process technology. Thus, for instance, the forming process of STI 109 can be more tightly controlled. For example, in one embodiment, the drain of the transistor structure is positioned one pitch away from the active gate, with an intervening dummy gate structure formed between the drain and active gate structure. The dummy gate structure is sacrificial in nature and can be utilized to create a self-aligned isolation recess, thereby eliminating or otherwise mitigating a number of the variation and dimensional constraints attendant STI 109 and other non-aligned isolation forming techniques. As will be appreciated in light of this disclosure, the transistor structure and forming techniques are compatible with both planar and non-planar (e.g., FinFET including double-gate and tri-gate, nanowire, ribbon, gate-all-around) transistor architectures.

Due to the self-aligned isolation or STI feature, the capability to aggressively scale the high-voltage transistor structure is much greater than that of standard high-voltage transistor structures, which rely on a variable alignment of the isolation (STI 109) to the gate as previously discussed with reference to FIG. 1. In some embodiments, the resulting transistor structure is free of the constraints solely attributable critical dimensions CD2 and CD3 of a standard VDMOS structure. For instance and according to one example embodiment, by self-aligning the gate-to-drain isolation recess, the forming process eliminates the process-induced footprint constraints associated with the patterning of the width of the STI 109 (CD1), as well as the alignment or overlap of the STI 109 with the gate (CD2) and the alignment or overlap of the N-well 111 and the STI 109 (CD3). By extending the drain one pitch away from the active gate according to some embodiments, the spacer of the dummy gate can be utilized to create a self-aligned isolation recess, thereby eliminating some of the variation and dimensional control limitations of a non-self-aligned structure. The resulting smaller footprint and tighter alignment reduce device variation and provide a compelling alternative for IO transistor utilization and other such high-voltage transistor applications.

Any number of structures processes supporting system-on-chip off-chip interfaces and high-voltage interfaces may benefit from an embodiment of the present disclosure. A transistor structure formed in accordance with an embodiment of the present disclosure may be detected, for example, using transmission electron microscopy (TEM) and scanning electron microscopy (SEM), or other standard imaging technology, to show a self-aligned isolation within the transistor. For example, the gate-to-drain isolation recess may be aligned with a sacrificial gate structure, such that the sidewalls of the gate-to-drain isolation effectively align with the inner sidewalls of the gate spacer of that sacrificial gate structure, when the structure is viewed in cross-section. The isolation may continue up through the space between the gate spacer of that sacrificial gate structure, or alternatively may be under a more fully formed gate structure (configured with gate electrode and gate dielectric between the gate spacer), albeit a non-functional gate structure, given the underlying isolation rather than a channel region.

Thus, a transistor structure is provided that enables integration of high-voltage compliant transistors into an aggressively scaled, low-voltage process. As advanced technologies scale, it is increasingly difficult to incorporate traditional wide-gate, large-footprint devices alongside tight-pitch digital transistors. This disclosure enables the footprint and gate length differential between high-voltage and logic transistors to more closely converge, according to some embodiments.

Architecture and Methodology

Figure 2:
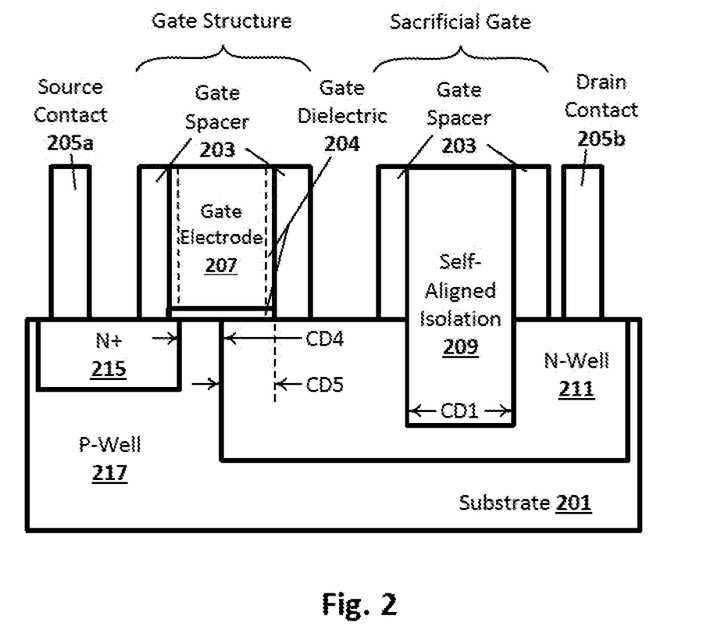
FIG. 2 illustrates a cross-sectional view of a high-voltage transistor device configured in accordance with an embodiment of the present disclosure.

FIG. 2 illustrates a cross-sectional view of a high-voltage transistor device configured in accordance with an embodiment of the present disclosure. Note that this example embodiment has a particular polarity scheme (N+ diffusion regions along with N-well sitting in p-type substrate). Other embodiments may have other polarity schemes, and the present disclosure is not intended to be limited to any particular one. For instance, another example embodiment might have P+ diffusion regions along with P-well sitting in n-type substrate. To this end, numerous transistor configurations having any number of polarity schemes, with or without wells, may benefit from the self-aligned isolation techniques provided herein.

As can be seen in this example embodiment, an N-well 211 is formed on a p-type substrate 201, and a P-well 217 is provided by virtue of the p-type substrate 201. A self-aligned trench isolation (STI) region 209 is formed within the N-Well 211 to provide isolation between the drain and gate regions. The N-well 211 may be formed in the semiconductor substrate 201, for example, through ion implantation and/or diffusion of dopant(s) having the N-type conductivity, which is opposite that of the substrate 201 and P-well 217. A first, active gate structure is formed on an upper portion of the N-well 211 and the p-type substrate 201. A second, effectively sacrificial gate structure is also provided next to the active gate structure, and is used in forming the STI 209. Diffusion region 215 is formed in the p-type substrate 101 near one edge of the gate electrode 207 to serve as the source region.

The gate structure includes gate electrode 207, gate dielectric 204, and gate spacer 203, and may be formed by various gate-first methods or gate-later or so-called remove metal gate (RMG) methods (e.g., where an initially provisioned dummy gate electrode of polysilicon or other dummy material is later removed along with any dummy gate dielectric material and replaced with desired metal gate electrode and gate dielectric materials). The final active gate structure can be implemented with standard materials. For instance, the gate spacer 203 can be silicon oxide or silicon nitride or any other suitable spacer material. The gate dielectric 204 may be formed, for example, from materials such as silicon dioxide or high-k dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Further note that, in some embodiments, the gate dielectric 204 is provided on the sidewalls of the gate spacer 203 as well as on the underlying substrate 201, as further shown with dashed lines in FIG. 2. Such a U-shaped gate dielectric 204 may be used, for instance, in non-planar transistor configurations, such as FinFET configurations. The gate electrode 207 material may be a gate electrode material such as, for example, aluminum, tungsten, titanium, tantalum, nickel, platinum, highly doped silicon, a silicide of one of these (e.g., titanium silicide, nickel silicide, etc) or a combination of such material layers. As previously noted, the gate structure may be formed on a planar channel region or a non-planar channel region. For instance, in some embodiments, the gate structure is formed on a fin-shaped semiconductor body that extends from the substrate 201 and provides multiple gates (e.g., double-gate, tri-grate, and gate-all-around channel configurations). In such cases, note that in the cross-section of FIG. 2, the cross-section is taken parallel to the fin and through the fin. Alternatively, FIG. 2 can also be used to show the cross-section of a planar device. Any number of planar and non-planar configurations can be implemented using the self-aligned isolation techniques provided herein.

The sacrificial gate structure may be implemented in the same fashion as the active gate, to keep from deviating from a consistent process. In any case, this neighboring sacrificial gate structure can be used in forming the STI 209. In particular, note that the STI 209 has a cross-sectional width that substantially corresponds to the cross-sectional width between spacers 203 of the sacrificial gate, this distance being designated as CD1 in FIG. 2. Further note that the edges of the STI 209 substantially align to the inside edges of the spacer 203, allowing for some deviation attributable to real world limitations associated with etching down into the N-well 211. The STI region 209 may be formed in the N-well 211, for example, through chemical etching of the sacrificial gate electrode material and underlying N-well 211 semiconductor material, followed by filling the resulting STI trench with an insulation material. The gate spacer 203 of the sacrificial gate structure acts as a template for the etch STI trench etch and deposition process, and may be implemented with a material selective to the STI trench etch process, such that the etch chemistry employed removes any sacrificial gate material (e.g., polysilicon and silicon dioxide) and the underlying semiconductor material of N-well 211 but not the gate spacer 203 material. In some embodiments, masking may be used in conjunction with the gate spacer 203 when forming the STI 209, if a selective etch chemistry is not available, so as to protect exposed materials other than gate spacer 203. Once the STI 209 trench is formed, the STI 209 material can then be deposited therein, such as silicon dioxide, silicon nitride, or other suitable insulator. In some embodiments, the STI 209 material is a high-k dielectric, such as that which may be used for the gate dielectric 204. In the embodiment shown, note that the STI 209 fills the entire trench. In other embodiments, the STI 209 may only fill the part of the trench occupied in the N-well 211, such that the upper part of the trench can be populated with normal gate materials (for the purpose of having a consistent process, even though that particular gate will not have a functional channel).

The source and drain diffusion regions (215 and 211, respectively) may be, for example, heavily doped with N+ dopant(s) to improve contact resistance between the metal contact layer (205a and 205b) and the underlying semiconductor material of the diffusion (source/drain) regions. However, the level of doping may vary from one embodiment to the next, as will be appreciated. In some cases, for instance, the N-well 211 is configured as a low-doped drain. Note that the semiconductor material in the diffusion regions 211 and 215 may be native to the substrate 201 (e.g., silicon substrate and diffusion areas, or III-V material substrate and diffusion regions), or alternatively may be a replacement material that is provided by, for example, a recess and deposition process (e.g., silicon substrate and silicon germanium diffusion regions, or gallium arsenide substrate and indium arsenide diffusion regions). Further note that the diffusion regions may be planar or non-planar, just as with the gate and channel region. Also, and as previously explained, other embodiments may have other diffusion polarities, depending on the intended application or transistor functionality, and the example polarity scheme shown is not intended to limit the present disclosure.

An insulation layer (not shown, such as silicon dioxide, silicon nitride, or other suitable insulator material) can then be grown or otherwise deposited over the entire surface of the substrate 201, followed by planarization. The source contact 205a and drain contact 205b can then be formed using a contact trench etch process to expose the underlying diffusion areas followed by a deposition of the contact metal structure, which may include one or more contact layers (e.g., in addition to a standard metal plug layer, the contact may optionally include one or more of a liner layer, barrier layer, resistance-reducing metal layer, capping layer, or any other contact structure layer). Many configurations are possible, as will be appreciated in light of this disclosure.

Due to the self-aligned STI 209 feature, the capability to aggressively scale the high-voltage transistor structure is much greater than that of standard high-voltage transistor structures, which rely on a variable alignment of a non-self-aligned isolation to the gate, as discussed with reference to FIG. 1 and STI 109. With reference to the embodiment shown in FIG. 2, note that the width of STI 209 (CD1) can be much smaller by virtue of self-aligned gate-to-drain isolation recess 209. Further note that the constraints associated with the alignment or overlap of the STI 209 with the gate (CD2) and the alignment or overlap of the N-well 211 and the STI 209 (CD3) are eliminated. Thus, by extending the drain to one pitch away from the active gate according to some embodiments, the spacer 203 of the sacrificial gate can be utilized to create a self-aligned isolation recess, thereby eliminating some of the variation and dimensional control limitations of a non-self-aligned structure, and allowing a smaller footprint. Note that the footprint of a transistor device having a non-self-aligned STI is greater than four polysilicon (dummy gate electrode) pitches, while the footprint of a transistor device having a self-aligned STI according to one example embodiment is less than two polysilicon (dummy gate electrode) pitches, assuming the drain of the transistor is positioned one pitch away from the active gate, with the intervening sacrificial gate structure formed between the drain and active gate structure. In still other embodiments, the drain of the transistor may be positioned two or even three pitches away from the active gate, and the footprint may still be smaller than a transistor device having a non-self-aligned STI.

Figure 3A:
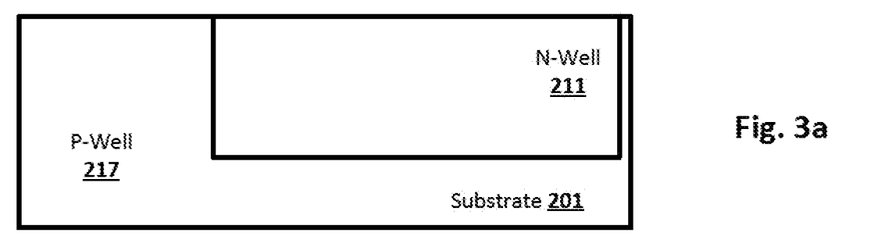
FIGS. 3a-g collectively illustrate a method for forming a high-voltage transistor device, in accordance with an embodiment of the present disclosure.
Figure 3B:
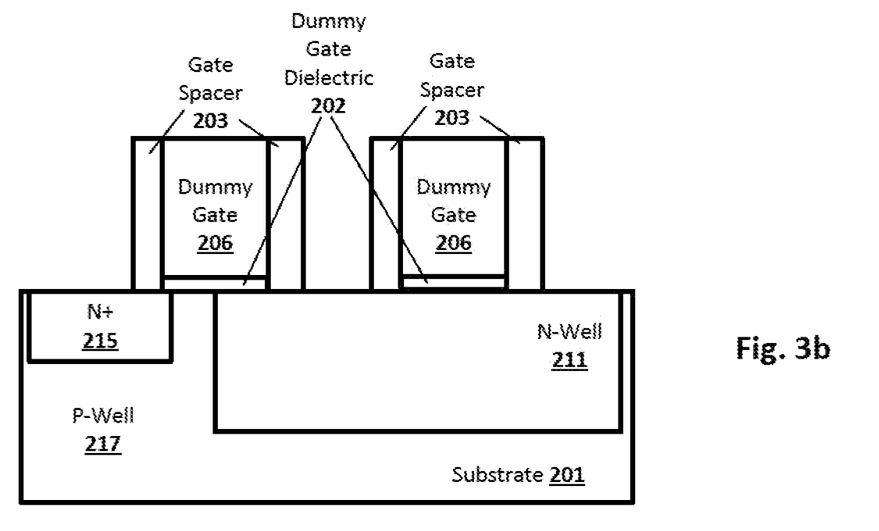
Figure 3C:
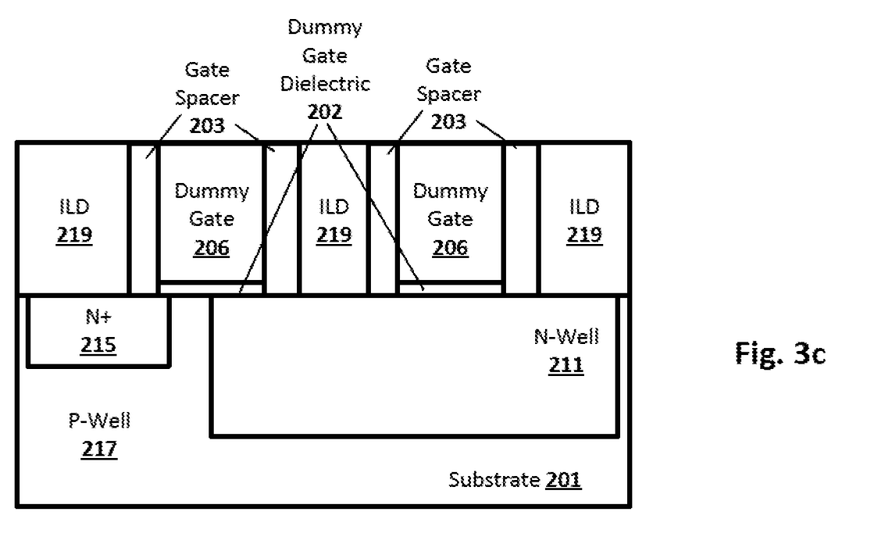
Figure 3D:
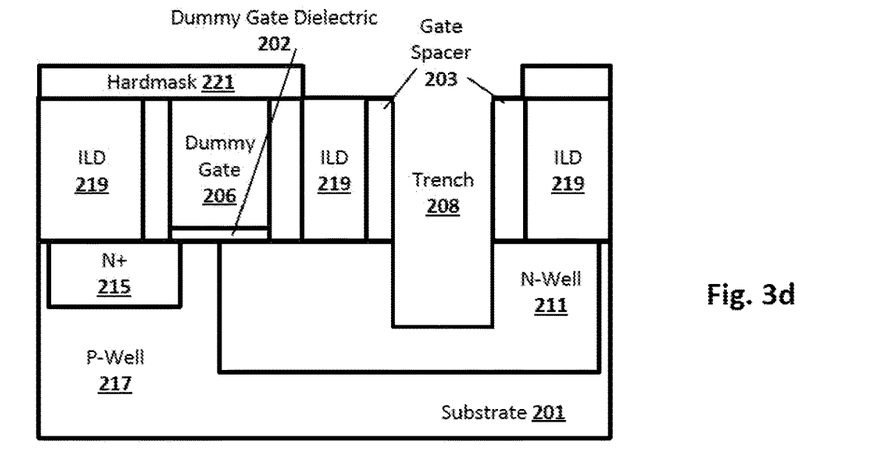
Figure 3E:
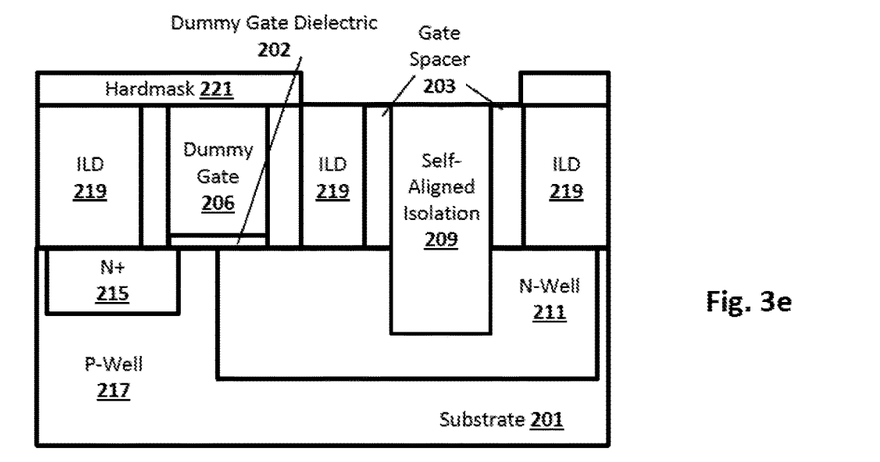
Figure 3F:
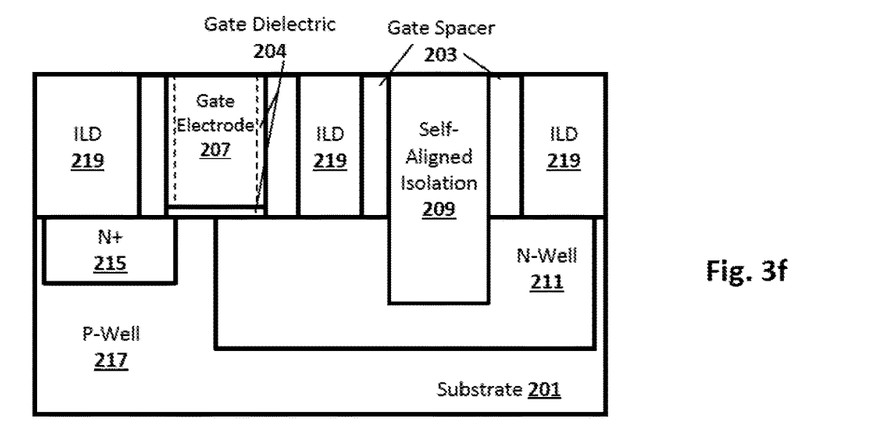
Figure 3G:
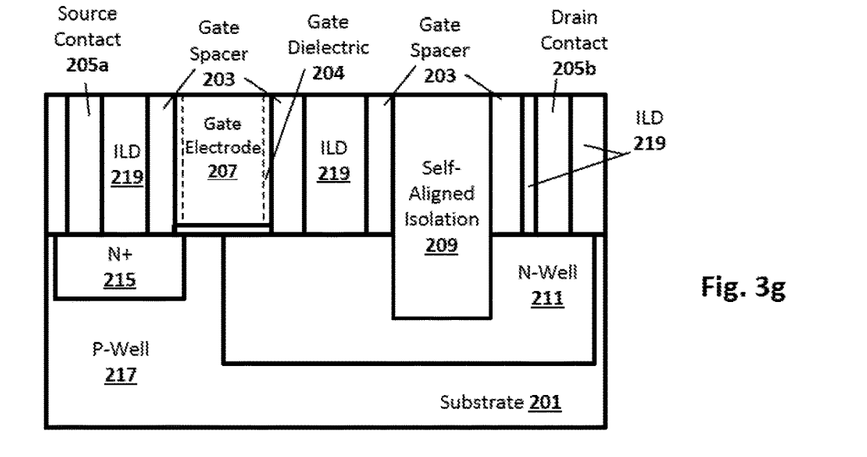

FIGS. 3a-g collectively illustrate a method for forming a high-voltage transistor device, in accordance with an embodiment of the present disclosure. FIGS. 3f-3g' illustrate an alternative embodiment, and will be explained in turn. As can be seen, various structures resulting from the example process flows are depicted in cross-section. The transistor being formed might be, for example, high-voltage VDN-MOS transistor configuration or any other high-voltage transistor device requiring an isolation between the gate and a given diffusion region. Other embodiments may include, for instance, other NMOS and/or PMOS power transistor configurations (e.g., lateral double-diffused MOS or so-called lateral DMOS). As will be appreciated, the methodology is fully compatible with standard advanced CMOS processing techniques, although any semiconductor processing techniques suitable for power transistor fabrication can be used. Also note the methodology may further include other intermediate stages and processing steps not shown but that can be carried out using standard techniques or as otherwise normally done. Numerous power transistor fabrication schemes will be apparent in light of this disclosure depending on factors such as desired polarity and target footprint, and the present disclosure is not intended to be limited to any specific ones; rather, any number of such fabrication schemes can be configured with a self-aligned isolation between the gate and drain (or source, as the case may be) as variously provided herein.

FIG. 3a illustrates a standard well formation, where an N-well 211 is formed inside of a P-well 217, in accordance with one example embodiment of the present disclosure. The P-well is provided by virtue of a p-type substrate 201. As previously explained, the N-well 211 may be formed in the substrate 201, for example, through ion implantation and/or diffusion of dopant(s) having the N-type conductivity, which is opposite that of the substrate 201 and P-well 217. In one example embodiment, the N-well 211 acts as the low-doped drain, and provides conduction from the drain to the active gate, although any number of doping schemes suitable for a given power transistor application can be used. The substrate 201 may be, for example, a bulk substrate or a semiconductor-on-insulator (SOI) substrate or a multilayer substrate. In any case, the substrate can be doped accordingly to provide the P-well 217, followed by a further doping to provide the N-well 211, as normally done. A common configuration would be, for example, a bulk silicon substrate doped with boron to provide the P-well 217 and phosphorus to provide the N-well 211 and N+ diffusion area 215.

FIG. 3b shows the resulting structure after the dummy gate structures and N+ diffusion region 215 are formed on the substrate 201, in accordance with one example embodiment of the present disclosure. Two gate structures are shown for purposes of discussion, but any number may be provisioned. As can be seen, each gate structure includes a dummy gate 206 and gate spacer 203 and an optional dummy gate dielectric 202, where the dummy gate 206 (and dummy gate dielectric 204, if present) are re-aligned to the edge of the N-well 211. In this particular embodiment, the N-well is under the gate spacer 203 and a portion of the gate dielectric 202. In a similar fashion, the N+ diffusion region 215 is also under the gate spacer 203 and a portion of the gate dielectric 202. The channel of the device is under the dummy gate dielectric 202 and between the N+ diffusion 215 and the N-well 211. Recall the channel length is CD4, as shown in FIG. 1. In still other embodiments, the channel may be longer, such that at least one of the N-well 211 and the N+ diffusion region 215 is only under the gate spacer 203 and not the gate dielectric 202. In a more general sense, the channel length and doping levels of the N-well 211 and the N+ diffusion region 215 (or the P-well and the P+ diffusion region, as the case may be) can be set depending on desired performance, as normally done. In some example such embodiments, the gate structures can be formed using standard CMOS dummy gate/spacer formation, where a dummy gate dielectric layer of silicon or polysilicon is deposited followed by a layer of polysilicon to form the dummy gate layer (note that both dummy gate dielectric 202 and dummy gate 206 can be polysilicon). This gate material layer is then masked and etched to form individual dummy gate stacks each including an optional dummy gate dielectric 202 and a dummy gate 206. Then a spacer layer of, for instance, silicon nitride can then be deposited thereon, followed by a planarization process to provide the gate spacer 203 on the sides of each gate stack.

FIG. 3c shows the resulting structure after the interlayer dielectric (ILD) 219 has been provided and planarized, in accordance with one example embodiment of the present disclosure. The ILD 219 can be any suitable insulator material, such as silicon dioxide, or high-k dielectric materials as previously explained. In some embodiments, the ILD 219 is provisioned by way of standard epitaxial growth, although any suitable deposition process can be used.

FIG. 3d shows the resulting structure after hardmask 221 has been provided and patterned as shown to expose the second dummy gate, and after that dummy gate has been etched away to provide trench 208, in accordance with an example embodiment of the present disclosure. The etch can be carried using any suitable dry and/or wet etch, depending on the material systems in place and as will be appreciated. The hardmask 221 can be, for example, an oxide, nitride, or oxide/nitride bi-layer stack. A selective etch is then performed to remove the dummy gate 206 (and the dummy gate dielectric 202 material, if present) and also an underlying portion of the substrate within the N-well 211. As can be seen, the selectivity of this etch enables the ILD 219 and spacer 203 films to remain substantially unetched, according to one such embodiment. In one example configuration having a silicon substrate 101, silicon dioxide ILD 219, polysilicon gate 206, and a silicon nitride gate spacer 203, this etch is carried out using an etchant such as tetramethyl ammonium hydroxide (TMAH) such that only the polysilicon gate 206 material and silicon substrate 101 material are removed (and any dummy gate dielectric 202, if present). In other embodiments, the mask 221 may be configured to cover the entire structure except for the sacrificial gate material to be removed by the etch process. Note that the mask need not cover the spacer 203 material, which is also impervious to the etch chemistry that forms trench 208 (no mask alignment is needed in such embodiments). The etch process need only be selective to the mask 221 and spacer 203 in such cases. Numerous suitable patterned mask and wet and/or dry etch schemes can be used to facilitate the removal of the dummy gate. As will be further appreciated, the depth of the trench 208 can vary from one embodiment to the next, but in some cases the trench 208 extends through at least 50% of the N-well 211 height. Example trench depths into the N-well 211 (or P-well, as the case may be) may range, for instance, from 25% to 85% of the overall well height. So long as the self-aligned isolation 209 provides suitable isolation between the corresponding diffusion and channel region, but doesn't completely isolate those two regions. In a more general sense, the trench 208 depth can be set as typically done, or to otherwise ensure proper isolation between the channel and given diffusion area.

FIG. 3e shows the resulting structure after a second deposition of insulator material has been provided into trench 208 to provide the self-aligned isolation 209, in accordance with an example embodiment of the present disclosure. Note that the deposition may create an overburden of material at the trench 208 opening, which can be resolved with subsequent planarization. This self-aligned insulator material may be, for example, an oxide or nitride and may be the same material as ILD 219 in some cases (e.g., silicon dioxide, silicon nitride, or high-k dielectric, depending on desired degree of isolation and voltages of target application). Note that the length CD1 of the self-aligned isolation 209 substantially tracks with the distance between the gate spacer 203 of the dummy gate structure, and is hence self-aligned within the N-well 211.

FIG. 3f shows the resulting structure after the hardmask 221 has been removed and the standard RMG process has been carried out to replace the other depicted dummy gate structure (on the left side) with an active gate structure that includes a gate dielectric 204 and gate electrode 207, in accordance with an embodiment of the present disclosure. As previously explained, the gate dielectric 204 may be, for example, silicon dioxide or high-k dielectric materials, and the gate electrode may be, for example, aluminum, tungsten, titanium, tantalum, nickel, platinum, highly doped silicon, a silicide of one of these (e.g., titanium silicide, nickel silicide, etc) or a combination of such material layers. Further recall that the gate dielectric 204 may be provided on the sidewalls of the gate spacer 203 in some embodiments, as generally shown in FIG. 3f with dashed lines. FIG. 3g shows the resulting structure after standard contact patterning is carried out to provide source contact 205a and drain contact 205b, in accordance with an embodiment of the present disclosure. Similar contact materials with respect to the gate electrode 207 can be used to implement the source and drain contacts 205a-b. Any number of suitable contact configurations can be used.

FIG. 3f' shows an alternative embodiment where, rather than completely filling trench 208 with the insulator material of isolation 209, the isolation 209 only partially fills the trench, and a second gate structure is further provisioned in the top portion of trench 208, including a gate electrode 207 and a gate dielectric 204 (which may also be U-shaped in some cases, as shown with dashed lines). Such a process allows each gate structure to be treated and processed the same at the RMG phase of the process, after the insulator material of isolation 209 has been provisioned. In this example case, the self-aligned isolation 209 is within the underlying semiconductor material of the N-well 211 and under the gate electrode and the gate dielectric. Note that in such embodiments, the deposition of insulator material when forming the self-aligned isolation 209 may only partially fill the trench between the gate spacer 203. After the isolation 209, is formed, a high-k gate dielectric and gate electrode can be provided per RMG processing, yielding the structure in FIG. 3f'. As previously explained, this additional gate structure is not functional. FIG. 3g' shows the resulting structure after standard contact patterning is carried out to provide source contact 205a and drain contact 205b, in accordance with one such example embodiment of the present disclosure.

Example System

Figure 4:
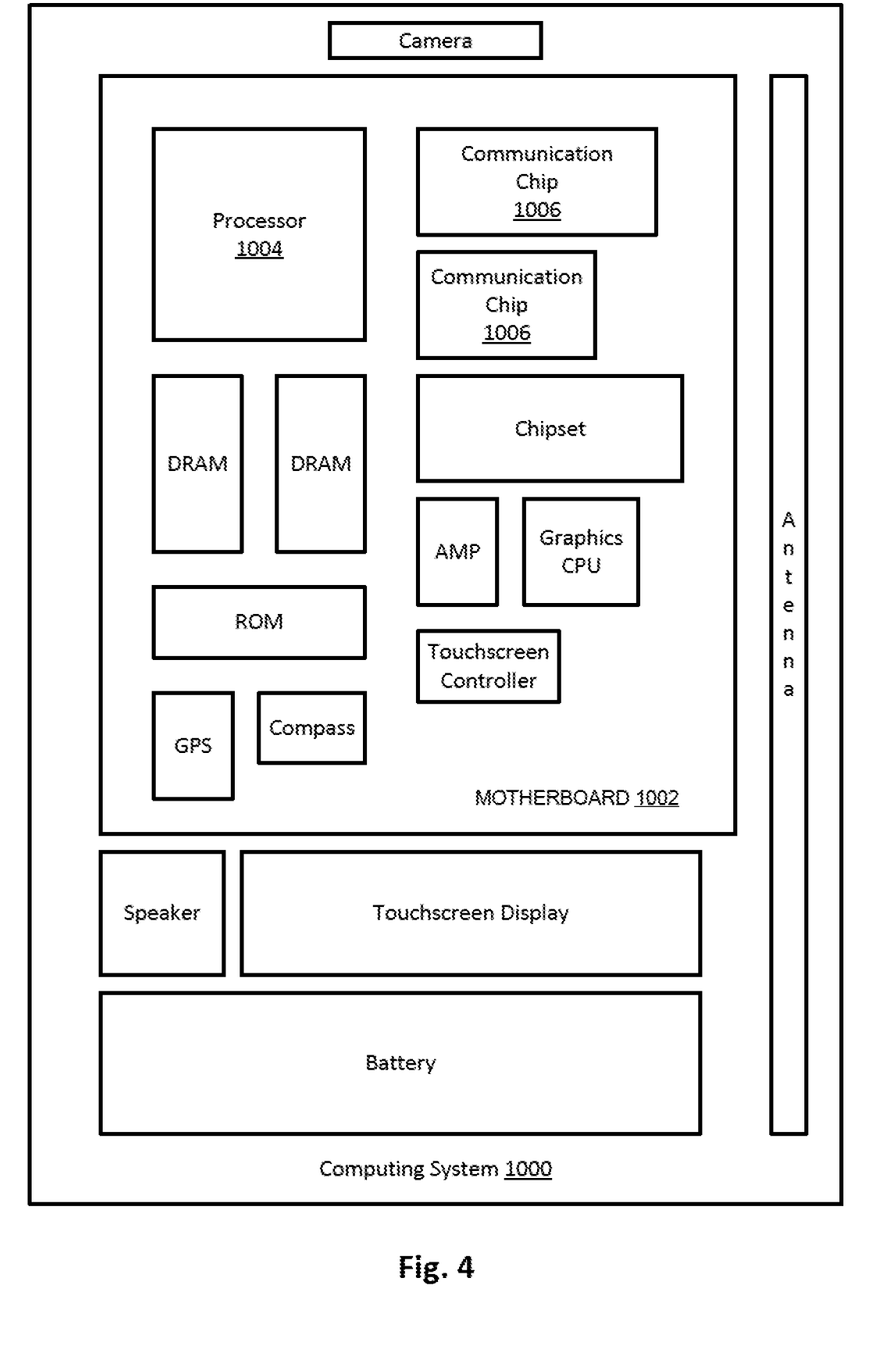
FIG. 4 illustrates a computing system implemented with one or more integrated circuit structures configured in accordance with an embodiment of the present disclosure.

FIG. 4 illustrates a computing system implemented with one or more integrated circuit structures configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with high-voltage transistors as provided herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some such example embodiments of the present disclosure, the integrated circuit die of the processor 1004 may include one or more high-voltage transistors including a self-aligned isolation as provided herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more high-voltage transistors as provided herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs high-voltage or power transistors configured with self-aligned isolation as described herein. As will be appreciated in light of this disclosure, various embodiments of the present disclosure can be used to improve performance on products fabricated at any process node (e.g., in the micron range, or sub-micron and beyond) by allowing for the use of high-voltage transistors.

Further Example Embodiments

The following examples pertain to further embodiments, from which numerous permutations and configurations will be apparent.

Example 1 is a high-voltage transistor device, comprising: a first gate structure over a channel region, the first gate structure having a gate spacer; a source region to one side of the first gate structure; a drain region to another side of the first gate structure; and an isolation aligned to a gate spacer of a second gate structure above the isolation, the isolation comprising insulation material and located between the channel region and one of the source or drain regions.

Example 2 includes the subject matter of Example 1, further including: a semiconductor substrate having a first polarity, the substrate further configured with the channel region; a well in the substrate and having a second polarity opposite the first polarity, the well associated with one of the source and drain regions; and a diffusion area in the substrate, such that the channel region is between the diffusion area and the well, the diffusion area associated with the other one of the source and drain regions.

Example 3 includes the subject matter of Example 2, wherein the substrate is a p-type substrate and the well is an N-well, and the diffusion area is an N+ diffusion area.

Example 4 includes the subject matter of Example 2, wherein the substrate is an n-type substrate and the well is a P-well, and the diffusion area is a P+ diffusion area.

Example 5 includes the subject matter of any of Examples 2 through 4, wherein the well is under one side of the gate structure and the diffusion area is under an opposing side of the gate structure.

Example 6 includes the subject matter of any of the previous Examples, further including: a first metal contact over the diffusion area; and a second metal contact over the well, such that the isolation is between the second metal contact and the channel region.

Example 7 includes the subject matter of any of the previous Examples, wherein the isolation passes through the gate spacer of the second gate structure and continues into underlying semiconductor material.

Example 8 includes the subject matter of Example 7, wherein the underlying semiconductor material comprises an N-well.

Example 9 includes the subject matter of any of the previous Examples, wherein each of the first and second gate structures further comprises at least one of: a gate electrode; and a gate dielectric layer under the gate electrode; wherein the isolation is within underlying semiconductor material and under at least one of the gate electrode and the gate dielectric of the second gate structure.

Example 10 includes the subject matter of any of the previous Examples, wherein the device is a planar transistor and the channel region comprises a portion of a planar substrate.

Example 11 includes the subject matter of any of Examples 1 through 9, wherein the device is a non-planar transistor and the channel region comprises as a fin extending from an underlying substrate.

Example 12 includes the subject matter of any of Examples 1 through 9, wherein the device is a non-planar transistor and the channel region comprises one or more semiconductor wires.

Example 13 includes the subject matter of any of Examples 1 through 9, wherein the device is a non-planar transistor and the channel region comprises one or more semiconductor ribbons.

Example 14 includes the subject matter of any of the previous Examples, further including an underlying substrate of semiconductor material, wherein semiconductor material of the channel region is native to the underlying substrate of semiconductor material.

Example 15 includes the subject matter of any of Examples 1 through 13, further including an underlying substrate of semiconductor material, wherein semiconductor material of the channel region is different from the underlying substrate of semiconductor material.

Example 16 includes the subject matter of any of the previous Examples, further including an underlying substrate of semiconductor material, wherein semiconductor material of the source and drain regions is native to the underlying substrate of semiconductor material.

Example 17 includes the subject matter of any of Examples 1 through 15, further including an underlying substrate of semiconductor material, wherein semiconductor material of the source and drain regions is different from the underlying substrate of semiconductor material.

Example 18 is a semiconductor transistor device, comprising: a semiconductor substrate having a first polarity, the substrate further configured with a channel region; a well in the substrate and having a second polarity opposite the first polarity; a diffusion area formed in the substrate, such that the channel region is between the diffusion area and the well; a first gate structure including a gate electrode above the channel region, and a gate dielectric layer between the gate electrode and the channel region, and a gate spacer; a second gate structure including a gate spacer; an isolation aligned with the gate spacer of the second gate structure and extending into the well below the second gate structure, the isolation comprising insulation material; a first metal contact over the diffusion area; and a second metal contact over the well, such that the isolation is between the second metal contact and the channel region.

Example 19 includes the subject matter of Example 18, wherein the substrate is a p-type substrate and the well is an N-well, and the diffusion area is an N+ diffusion area.

Example 20 includes the subject matter of Example 18, wherein the substrate is an n-type substrate and the well is a P-well, and the diffusion area is a P+ diffusion area.

Example 21 includes the subject matter of any of Examples 18 through 20, wherein the well is under one side of the gate structure and the diffusion area is under an opposing side of the gate structure.

Example 22 includes the subject matter of any of Examples 18 through 21, wherein the isolation passes through the gate spacer of the second gate structure and continues into semiconductor material of the well.

Example 23 includes the subject matter of Example 22, wherein the well is an N-well.

Example 24 includes the subject matter of any of Examples 18 through 23, wherein the second gate structure further comprises at least one of: a gate electrode; and a gate dielectric layer under the gate electrode; wherein the isolation is within underlying semiconductor material of the well and under at least one of the gate electrode and the gate dielectric of the second gate structure.

Example 25 includes the subject matter of any of Examples 18 through 24, wherein the device is a planar transistor and the channel region comprises a portion of a planar substrate.

Example 26 includes the subject matter of any of Examples 18 through 24, wherein the device is a non-planar transistor and the channel region comprises as a fin extending from an underlying substrate.

Example 27 includes the subject matter of any of Examples 18 through 24, wherein the device is a non-planar transistor and the channel region comprises one or more semiconductor wires.

Example 28 includes the subject matter of any of Examples 18 through 24, wherein the device is a non-planar transistor and the channel region comprises one or more semiconductor ribbons.

Example 29 includes the subject matter of any of Examples 18 through 28, further including an underlying substrate of semiconductor material, wherein semiconductor material of the channel region is native to the underlying substrate of semiconductor material.

Example 30 includes the subject matter of any of Examples 18 through 28, further including an underlying substrate of semiconductor material, wherein semiconductor material of the channel region is different from the underlying substrate of semiconductor material.

Example 31 includes the subject matter of any of Examples 18 through 30, further including an underlying substrate of semiconductor material, wherein semiconductor material of the diffusion region and the well is native to the underlying substrate of semiconductor material.

Example 32 includes the subject matter of any of Examples 18 through 30, further including an underlying substrate of semiconductor material, wherein semiconductor material of the diffusion region and the well is different from the underlying substrate of semiconductor material.

Example 33 is a method for forming a high-voltage transistor device, the method comprising: providing a first gate structure over a channel region, the first gate structure having a gate spacer; providing a source region to one side of the first gate structure; providing a drain region to another side of the first gate structure; and providing an isolation aligned to a gate spacer of a second gate structure above the isolation, the isolation comprising insulation material and located between the channel region and one of the source or drain regions.

Example 34 includes the subject matter of Example 33, and further includes: providing a semiconductor substrate having a first polarity, the substrate further configured with the channel region; providing a well in the substrate, the well having a second polarity opposite the first polarity, the well associated with one of the source and drain regions; providing a diffusion area in the substrate, such that the channel region is between the diffusion area and the well, the diffusion area associated with the other one of the source and drain regions; providing a first metal contact over the diffusion area; and providing a second metal contact over the well, such that the isolation is between the second metal contact and the channel region.

Example 35 includes the subject matter of Example 34, wherein the substrate is a p-type substrate and the well is an N-well, and the diffusion area is an N+ diffusion area.

Example 36 includes the subject matter of Example 34, wherein the substrate is an n-type substrate and the well is a P-well, and the diffusion area is a P+ diffusion area.

Example 37 includes the subject matter of any of Examples 34 through 36, wherein the well is under one side of the gate structure and the diffusion area is under an opposing side of the gate structure.

Example 38 includes the subject matter of any of Examples 33 through 37, wherein providing the isolation aligned to the gate spacer comprises: removing at least one of dummy gate electrode material and dummy gate dielectric material from the second gate structure, thereby providing a trench aligned with the gate spacer of the second gate structure, the trench extending into underlying semiconductor material; and depositing the insulation material into the trench to provide the isolation self-aligned to the gate spacer.

Example 39 includes the subject matter of Example 38, wherein the isolation passes through the gate spacer of the second gate structure and continues into the underlying semiconductor material.

Example 40 includes the subject matter of Example 39, wherein the underlying semiconductor material comprises an N-well.

Example 41 includes the subject matter of any of Examples 33 through 40, wherein providing each of the first and second gate structures further comprises at least one of: providing a gate dielectric layer; and providing a gate electrode over the gate dielectric layer; wherein the isolation is within underlying semiconductor material and under at least one of the gate electrode and the gate dielectric of the second gate structure.

Example 42 includes the subject matter of any of Examples 33 through 41, wherein the device is a planar transistor and the channel region comprises a portion of a planar substrate.

Example 43 includes the subject matter of any of Examples 33 through 41, wherein the device is a non-planar transistor and the channel region comprises as a fin extending from an underlying substrate.

Example 44 includes the subject matter of any of Examples 33 through 41, wherein the device is a non-planar transistor and the channel region comprises one or more semiconductor wires.

Example 45 includes the subject matter of any of Examples 33 through 41, wherein the device is a non-planar transistor and the channel region comprises one or more semiconductor ribbons.

Example 46 includes the subject matter of any of Examples 33 through 45, further including an underlying substrate of semiconductor material, wherein semiconductor material of the channel region is native to the underlying substrate of semiconductor material.

Example 47 includes the subject matter of any of Examples 33 through 45, further including an underlying substrate of semiconductor material, wherein semiconductor material of the channel region is different from the underlying substrate of semiconductor material.

Example 48 includes the subject matter of any of Examples 33 through 47, further including an underlying substrate of semiconductor material, wherein semiconductor material of the source and drain regions is native to the underlying substrate of semiconductor material.

Example 49 includes the subject matter of any of Examples 33 through 47, further including an underlying substrate of semiconductor material, wherein semiconductor material of the source and drain regions is different from the underlying substrate of semiconductor material.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:
   a fin-shaped semiconductor body, the fin-shaped semiconductor body comprising silicon;
   a trench isolation region having a first side, a second side, a bottom, an upper portion and a lower portion, the upper portion above the fin-shaped semiconductor body and the lower portion in the fin-shaped semiconductor body, the lower portion defining a first portion of the fin-shaped semiconductor body and a second portion of the fin-shaped semiconductor body;
   a first gate spacer along at least part of the first side of the trench isolation region, the first gate spacer having a bottom above the bottom of the trench isolation region;
   a second gate spacer along at least part of the second side of the trench isolation region, the second gate spacer having a bottom above the bottom of the trench isolation region;
   a gate electrode over the first portion of the fin-shaped semiconductor body, the gate electrode having a first side and a second side;
   a third gate spacer along the first side of the gate electrode; and
   a fourth gate spacer along the second side of the gate electrode.

2. The integrated circuit structure of claim 1, wherein the gate electrode has an upper surface co-planar with an upper surface of the trench isolation region.

3. The integrated circuit structure of claim 1, further comprising a gate dielectric between the gate electrode and the fin-shaped semiconductor body.

4. The integrated circuit structure of claim 3, wherein the gate dielectric includes a U-shaped gate dielectric layer.

5. The integrated circuit structure of claim 1, wherein the trench isolation region extends into an N-well in the fin-shaped semiconductor body.

6. A computing device, comprising:
   a board; and
   a component coupled to the board, the component including an integrated circuit structure, comprising:
      a fin-shaped semiconductor body, the fin-shaped semiconductor body comprising silicon;
      a trench isolation region having a first side, a second side, a bottom, an upper portion and a lower portion, the upper portion above the fin-shaped semiconductor body and the lower portion in the fin-shaped semiconductor body, the lower portion defining a first portion of the fin-shaped semiconductor body and a second portion of the fin-shaped semiconductor body;
      a first gate spacer along at least part of the first side of the trench isolation region, the first gate spacer having a bottom above the bottom of the trench isolation region;
      a second gate spacer along at least part of the second side of the trench isolation region, the second gate spacer having a bottom above the bottom of the trench isolation region;
      a gate electrode over the first portion of the fin-shaped semiconductor body, the gate electrode having a first side and a second side;
      a third gate spacer along the first side of the gate electrode; and
      a fourth gate spacer along the second side of the gate electrode.

7. The computing device of claim 6, further comprising: a memory coupled to the board.

8. The computing device of claim 6, further comprising: a communication chip coupled to the board.

9. The computing device of claim 6, further comprising: an antenna coupled to the board.

10. The computing device of claim 6, wherein the component is a packaged integrated circuit die.

11. An integrated circuit structure, comprising:
    a fin-shaped semiconductor body, the fin-shaped semiconductor body comprising silicon;
    a trench isolation region having a bottom and a top, the trench isolation region defining a first portion of the fin-shaped semiconductor body and a second portion of the fin-shaped semiconductor body;
    a first gate electrode on the top of the trench isolation region, the first gate electrode having a first side and a second side;
    a first gate spacer along the first side of the first gate electrode, the first gate spacer having a bottom above the bottom of the trench isolation region;
    a second gate spacer along the second side of the first gate electrode, the second gate spacer having a bottom above the bottom of the trench isolation region;
    a second gate electrode over the first portion of the fin-shaped semiconductor body, the second gate electrode having a first side and a second side;
    a third gate spacer along the first side of the second gate electrode; and a fourth gate spacer along the second side of the second gate electrode.

12. The integrated circuit structure of claim 11, wherein the first gate electrode has an upper surface co-planar with an upper surface of the second gate electrode.

13. The integrated circuit structure of claim 11, further comprising a first gate dielectric between the first gate electrode and the trench isolation region, and a second gate dielectric between the second gate electrode and the first portion of the fin-shaped semiconductor body.

14. The integrated circuit structure of claim 13, wherein the first gate dielectric includes a first U-shaped gate dielectric layer, and wherein the second gate dielectric includes a second U-shaped gate dielectric layer.

15. The integrated circuit structure of claim 11, wherein the trench isolation region extends into an N-well in the fin-shaped semiconductor body.

16. A computing device, comprising:
a board; and
a component coupled to the board, the component including an integrated circuit structure, comprising:
    a fin-shaped semiconductor body, the fin-shaped semiconductor body comprising silicon;
    a trench isolation region having a bottom and a top, the trench isolation region defining a first portion of the fin-shaped semiconductor body and a second portion of the fin-shaped semiconductor body;
    a first gate electrode on the top of the trench isolation region, the first gate electrode having a first side and a second side;
    a first gate spacer along the first side of the first gate electrode, the first gate spacer having a bottom above the bottom of the trench isolation region;
    a second gate spacer along the second side of the first gate electrode, the second gate spacer having a bottom above the bottom of the trench isolation region;
    a second gate electrode over the first portion of the fin-shaped semiconductor body, the second gate electrode having a first side and a second side;
    a third gate spacer along the first side of the second gate electrode; and
    a fourth gate spacer along the second side of the second gate electrode.

17. The computing device of claim 16, further comprising:
a memory coupled to the board.

18. The computing device of claim 16, further comprising:
a communication chip coupled to the board.

19. The computing device of claim 16, further comprising:
an antenna coupled to the board.

20. The computing device of claim 16, wherein the component is a packaged integrated circuit die.

* * * * *